(12) United States Patent
Kwack et al.

(10) Patent No.: US 8,664,646 B2
(45) Date of Patent: Mar. 4, 2014

(54) ORGANIC LIGHT EMITTING DIODE DISPLAY

(75) Inventors: Jin-Ho Kwack, Yongin (KR); Dong-Won Han, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 70 days.

(21) Appl. No.: 13/300,493

(22) Filed: Nov. 18, 2011

(65) Prior Publication Data

US 2012/0256218 A1  Oct. 11, 2012

(30) Foreign Application Priority Data

Apr. 11, 2011  (KR) .................. 10-2011-0033396

(51) Int. Cl.
*H01L 29/08*  (2006.01)

(52) U.S. Cl.
USPC .................. 257/40; 257/59; 257/72; 257/77

(58) Field of Classification Search
USPC .................. 257/40, 59, 72; 345/77
See application file for complete search history.

(56) References Cited

U.S. PATENT DOCUMENTS

| 5,396,644 A | 3/1995 | Tzidon et al. |
| 2005/0142379 A1* | 6/2005 | Juni et al. ............ 428/690 |
| 2010/0156765 A1* | 6/2010 | Park et al. ............ 345/77 |

FOREIGN PATENT DOCUMENTS

| JP | 11-329742 | * 11/1999 |
| JP | 2008-538155 A | 10/2008 |
| KR | 10-0740309 | 7/2007 |
| KR | 10-0741129 B1 | 7/2007 |
| KR | 10-2008-0105308 A | 12/2008 |
| WO | WO2006/091614 A1 | 8/2006 |

* cited by examiner

*Primary Examiner* — Tan N Tran
(74) *Attorney, Agent, or Firm* — Christie, Parker & Hale, LLP (57) ABSTRACT

An organic light-emitting diode (OLED) display according to an exemplary embodiment may include: a substrate and an organic light emitting element on the substrate; a thin film encapsulation layer on the substrate and covering the organic light emitting element; and one or more scattering materials dispersed in the thin film encapsulation layer. According to the exemplary embodiment, light efficiency may be improved by dispersing scattering materials in at least one of an organic layer or an inorganic layer forming a thin film encapsulation layer with a large refractive index difference.

10 Claims, 6 Drawing Sheets

ORGANIC LIGHT EMITTING DIODE DISPLAY

CROSS-REFERENCE TO RELATED APPLICATION

This application claims priority to and the benefit of Korean Patent Application No. 10-2011-0033396 filed in the Korean Intellectual Property Office on Apr. 11, 2011, the entire content of which is incorporated herein by reference.

BACKGROUND

1. Field

Aspects of embodiments according to the present invention relate generally to an organic light emitting diode (OLED) display.

2. Description of the Related Art

An organic light emitting diode (OLED) display includes organic light emitting elements formed of a hole injection electrode, an organic emission layer, and an electron injection electrode. With the OLED display, electrons and holes are combined with each other in the organic emission layer to thereby generate excitons. When the excitons transition from the excited state to the ground state, energy is released so as to emit light, and images are displayed by the emitted light.

An OLED display is a flat panel display which can be made lightweight and thin because it has a self-luminous characteristic and requires no separate light source. Particularly, the OLED display exhibits characteristics such as low power consumption, high luminance, fast response speed, and as such, the OLED display is receiving much attention as a next-generation display device.

The organic light emitting element may deteriorate due to internal and external factors. Regarding the internal factors, the organic emissive layer deteriorates under the atmosphere of oxygen from indium tin oxide (ITO) being the electrode material, or under the interfacial reaction between organic layer components of the organic emissive layer. The external factors include external moisture and oxygen, and ultraviolet ray. In particular, as the external oxygen and moisture may seriously influence the life span of the organic light emitting diode, it is very important to package the organic light emitting diode such that it is sealed from the outside in a vacuum-tight manner.

A thin film encapsulation (TFE) technique may be introduced in packaging the organic light emitting diode, which is well known to those skilled in the art. With the thin film encapsulation technique, one or more of inorganic and organic layers are alternately deposited on the organic light emitting elements formed at the display area of the substrate, thereby covering the display area with a thin film encapsulation layer. With the OLED display with such a thin film encapsulation layer, if the substrate is formed with a flexible film, it can be bent easily, and may form a slim structure.

However, the thin film encapsulation layer is formed by alternately layering a plurality of inorganic layers and a plurality of organic layers, and thus light emitted from an organic emission layer may be wholly or substantially reflected while being passed through the thin film encapsulation layer. Thus, the light emitted from the organic emission layer cannot be emitted to the outside due to the total reflection so that light efficiency is deteriorated.

The above information disclosed in this Background section is only for enhancement of understanding of the background of the described technology, and therefore it may contain information that does not form the prior art that is already known in this country to a person of ordinary skill in the art.

SUMMARY

Aspects of embodiments according to the present invention are directed toward an organic light-emitting diode (OLED) display that can improve light efficiency.

An OLED display according to an exemplary embodiment includes: a substrate and an organic light emitting element on the substrate; a thin film encapsulation layer on the substrate and covering the organic light emitting element; and one or more scattering materials dispersed in the thin film encapsulation layer.

The thin film encapsulation layer may include organic layers and inorganic layers, and the scattering materials may be dispersed in the organic and inorganic layers.

The thin film encapsulation layer may include an organic layer and an inorganic layer, and the scattering materials may be dispersed in the organic layer.

The organic layer and the inorganic layer may include a plurality of alternately arranged organic layers and inorganic layers, and the scattering materials may be in a lower organic layer adjacent to the organic light emitting element among the plurality of organic layers.

The organic layer and the inorganic layer may include a plurality of alternately arranged organic layers and inorganic layers, and the scattering materials may be formed more in a lower organic layer adjacent to the organic light emitting element than in an upper organic layer adjacent to the external environment among the plurality of organic layers.

A diameter of the scattering material may be larger than ⅛ of a wavelength of light emitted from the organic light emitting element.

Diameters of the respective scattering materials may be between 100 nm and 500 nm.

A refractive index difference between the thin film encapsulation layer and the scattering materials may be between 0.2 and 1.7.

Refractive indexes of the scattering materials may be between 1.5 and 3.0.

According to the exemplary embodiments, light efficiency may be improved by dispersing scattering materials in at least one of an organic layer or an inorganic layer forming a thin film encapsulation layer with a large refractive index difference.

DETAILED DESCRIPTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Figure 1:
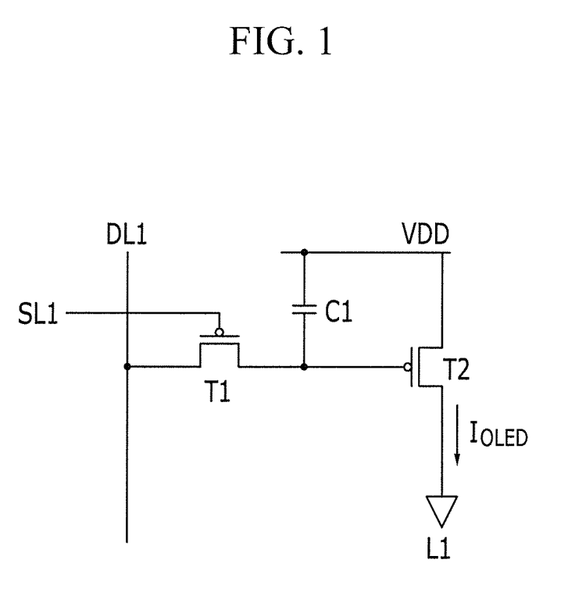
FIG. 1 is a schematic circuit diagram of a pixel circuit of an organic light emitting diode (OLED) display according to a first exemplary embodiment.
Figure 2:
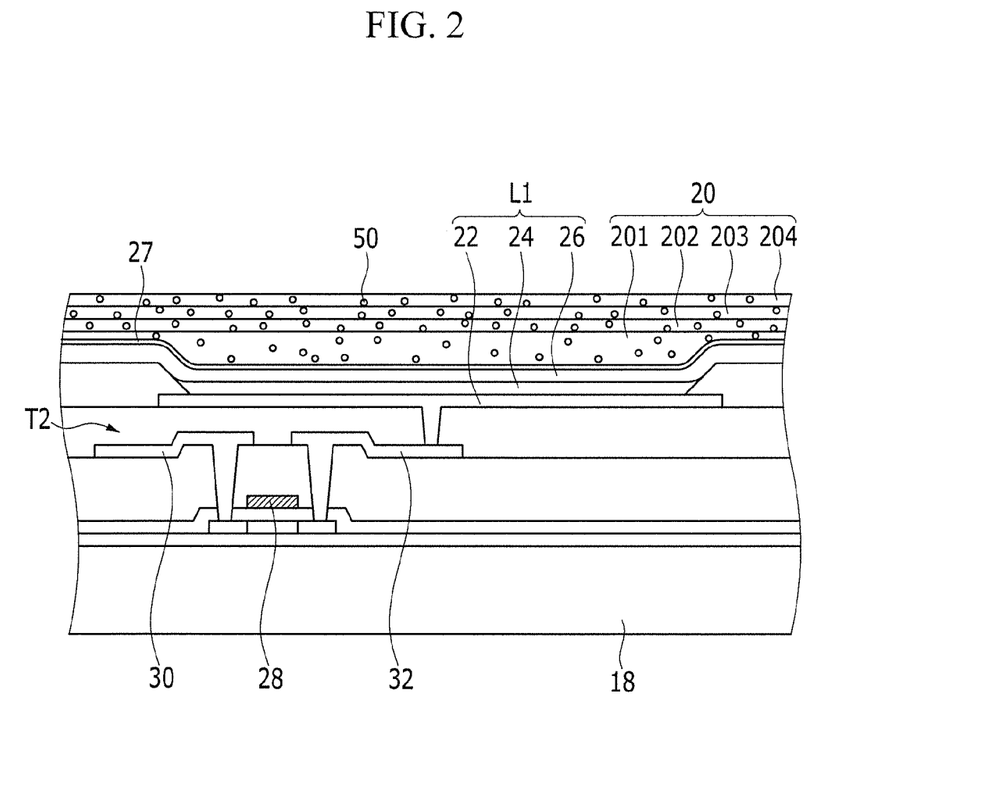
FIG. 2 is a cross-sectional view of the OLED display of FIG. 1.

FIG. 1 is a schematic circuit diagram of a pixel circuit of an organic light emitting diode (OLED) display according to an exemplary embodiment, and FIG. 2 is a cross-sectional view of the OLED display of FIG. 1.

As shown in FIG. 1 and FIG. 2, each pixel of the OLED display is formed of an organic light emitting element L1 and a driving circuit. The organic light emitting element L1 includes a first pixel electrode (e.g., hole injection electrode) 22, an organic emission layer 24, and a second pixel electrode (e.g., electron injection electrode) 26.

In addition to an emission layer (not shown) that emits light, the organic emission layer 24 may further include organic layers (not shown) for effectively transmitting hole carriers or electron carriers to the emission layer. The organic layers may be a hole injection layer (HIL), a hole transport layer (HTL), an electron injection layer (EIL), and an electron transport layer (ETL). The hole injection layer and the hole transport layer may be disposed between the first pixel electrode 22 and the emission layer and the electron injection layer and the electron transport layer may be disposed between the second pixel electrode 26 and the emission layer.

The driving circuit includes at least two thin film transistors T1 and T2 and at least one storage capacitor C1. The thin film transistor T1 may be a switching transistor, and the thin film transistor T2 may be a driving transistor.

The switching transistor T1 is coupled to a scan line SL1 and a data line DL1 and transmits a data voltage, which is input to the data line DL1 according to a switching voltage input to the scan line SL1, to the driving transistor T2. The storage capacitor C1 is coupled to the switching transistor T1 and a power source line VDD, and stores a voltage corresponding to a voltage difference between a voltage transmitted from the switching transistor T1 and a voltage supplied to the power source line VDD.

The driving transistor T2 is coupled to the power source line VDD and the storage capacitor C1, and supplies an output current $I_{OLED}$ that is proportional to a square of a difference between a voltage stored in the storage capacitor C1 and a threshold voltage, to the organic light emitting element L1. The organic light emitting element L1 emits light in accordance with the output current $I_{OLED}$. The driving transistor T2 includes a gate electrode 28, a source electrode 30, and a drain electrode 32. The first pixel electrode 22 of the organic light emitting element L1 may be coupled to the drain electrode 32 of the driving transistor T2. A configuration of the pixel is not limited to the above-stated example, and it may be variously modified.

As shown in FIG. 2, an organic layer may be formed on the second pixel electrode 26 as a covering layer 27 to protect and cover the second pixel electrode 26.

A thin film encapsulation layer 20 is formed on the covering layer 27. The thin film encapsulation layer 20 is formed on a plurality of organic light emitting elements L1 and the driving circuits formed on the substrate 18 to protect the organic light emitting elements L1 and the driving circuits by sealing them from the external environment.

The thin film encapsulation layer 20 includes organic layers 201 and 203 and inorganic layers 202 and 204. The organic layers 201 and 203 and the inorganic layers 202 and 204 are alternately layered. FIG. 2 exemplarily illustrates that two organic layers 201 and 203 and two inorganic layers 202 and 204 are alternately layered to form the thin film encapsulation layer 20.

Scattering materials 50 are dispersed in the organic layers 201 and 203 and the inorganic layers 202 and 204 that form the thin film encapsulation layer 20.

When a wavelength of light emitted from the organic emission layer 24 is $\lambda$, a diameter of each scattering material 50 should be larger than $\lambda/8$. When the diameter of the scattering material 50 is smaller than $\lambda/8$, light is not scattered in the scattering material 50 but is passed through the organic layers 201 and 203 or the inorganic layers 202 and 204 that form the thin film encapsulation layer 20, and then may be wholly reflected.

When light incident on the scattering materials 50 is visible light, the diameters of the respective scattering materials 50 may be between 100 nm and 500 nm. When a diameter of the scattering material 50 is smaller than 100 nm, the light may not be scattered but may be wholly reflected so that light efficiency cannot be improved, and when a diameter of the scattering material 50 is larger than 500 nm, the diameter becomes similar to the thickness of the organic layers 201 and 202 or the thickness of the inorganic layers 202 and 204 so that the scattering materials 50 cannot be easily dispersed in the organic layers 201 and 203 or the inorganic layers 202 and 204.

The scattering material 50 is a transparent oxide layer, and may be at least one selected from $TiO_2$, $ZrO_2$, $CeO_2$, $TaO_2$, or combinations thereof.

Refractive indexes of the scattering materials 50 may be between 1.5 and 3.0. When a refractive index of the scattering material 50 is smaller than 1.5, light efficiency cannot be improved, and when a refractive index of the scattering material 50 is larger than 3.0, the scattering material 50 becomes opaque so that the light efficiency may be deteriorated. As the refractive index of the scattering material 50 is increased, the light efficiency can be improved. A refractive index of $TiO_2$ is 2.6, a refractive index of $ZrO_2$ is 2.1, a refractive index of $CeO_2$ is 2.35, and a refractive index of $TaO_2$ is 2.1. These materials may be used as the scattering material 50.

The organic layers 201 and 203 forming the thin film encapsulation layer 20 have a refractive index of about 1.5, and therefore a refractive index difference between the thin film encapsulation layer 20 and the scattering materials 50 may be 0.2 to 1.7. When the refractive index difference between the thin film encapsulation layer 20 and the scattering materials 50 is smaller than 0.2, a scattering angle is small and thus whole scattering may occur, and when the refractive index between the thin film encapsulation layer 20 and the scattering materials 50 is larger than 1.7, the refractive index of the scattering material 50 is increased, and thus the scattering material 50 becomes opaque, thereby deteriorating light efficiency.

Figure 3:
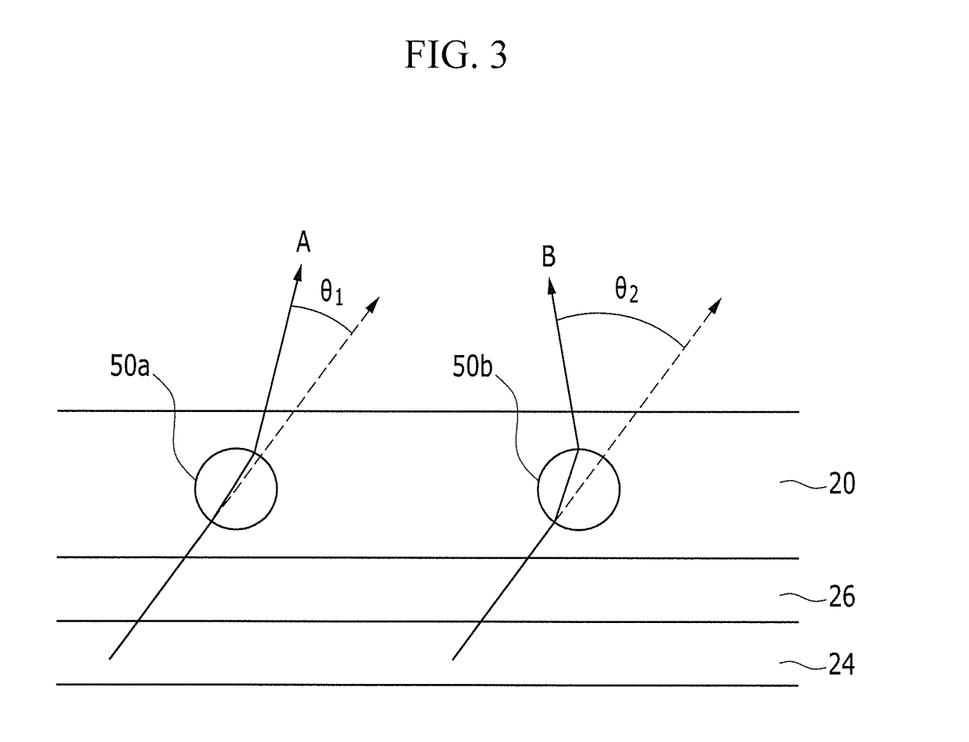
FIG. 3 shows a scattering angle of light according to a scattering material.

FIG. 3 shows scattering angles depending on the refractive index of the scattering material.

As shown in FIG. 3, the light (A) passed through a scattering material 50a having a low refractive index is scattered with a small scattering angle $\theta_1$. However, the light (B) passed through a scattering material 50b having a high refractive index is scattered with a large scattering angle $\theta_2$. That is, in the case of the scattering material 50a having the low refractive index, a refractive index difference between the inorganic layers 202 and 204 or the organic layers 201 and 203, forming the thin film encapsulation layer 20, and the scattering material 50a is small, and thus the scattering angle becomes small. In the case of the scattering material 50b, a refractive index difference between the inorganic layers 202 and 24 or the organic layers 201 and 203, forming the thin film encapsulation layer 20, and the scattering material 50b is large, and thus the scattering angle becomes large.

As described above, the light (A) passed through the scattering material 50b is scattered with a large scattering angle $\theta_2$ in the thin film encapsulation layer 20 so that the light is not wholly reflected in the thin film encapsulation layer 20. Accordingly, light passing through the thin film encapsulation layer 20 is increased, thereby improving light efficiency.

Table 1 illustrates light extraction efficiency, an increased rate of the light extraction efficiency, and color coordinates of a comparative example and the present exemplary embodiment for each of a red pixel, a green pixel, and a blue pixel.

TABLE 1

| pixel | Light efficiency (%) | | | Color coordinate | | |
|---|---|---|---|---|---|---|
| | Comparative example | Exemplary embodiment | Increase rate (%) of light efficiency | X, Y | Comparative example | Exemplary embodiment |
| Red pixel | 25.93 | 24.83 | −4.2 | X | 0.66 | 0.66 |
| | | | | Y | 0.34 | 0.34 |
| Green pixel | 35.04 | 36.23 | +3.4 | X | 0.16 | 0.16 |
| | | | | Y | 0.75 | 0.75 |
| Blue pixel | 56.2 | 65.1 | +15.8 | X | 0.14 | 0.14 |
| | | | | Y | 0.04 | 0.04 |

The comparative example is a conventional OLED display of which a scattering material is not dispersed in a thin film encapsulation layer, and the exemplary embodiment is an OLED display of which $CeO_2$ having a diameter between 100 nm and 500 nm is dispersed into the thin film encapsulation layer 20 as the scattering material 50.

As shown in Table 1, a green pixel and a blue pixel of the present exemplary embodiment had improved in light efficiency compared to a green pixel and a blue pixel of the comparative example, and no color coordinate change occurred even though the scattering materials 50 are dispersed in the thin film encapsulation 20.

Here, although the scattering materials are dispersed in both of the organic layer and the inorganic layer forming the thin film encapsulation layer according to the first exemplary embodiment, the scattering materials may be dispersed only in the organic layer forming the thin film encapsulation layer.

Figure 4:
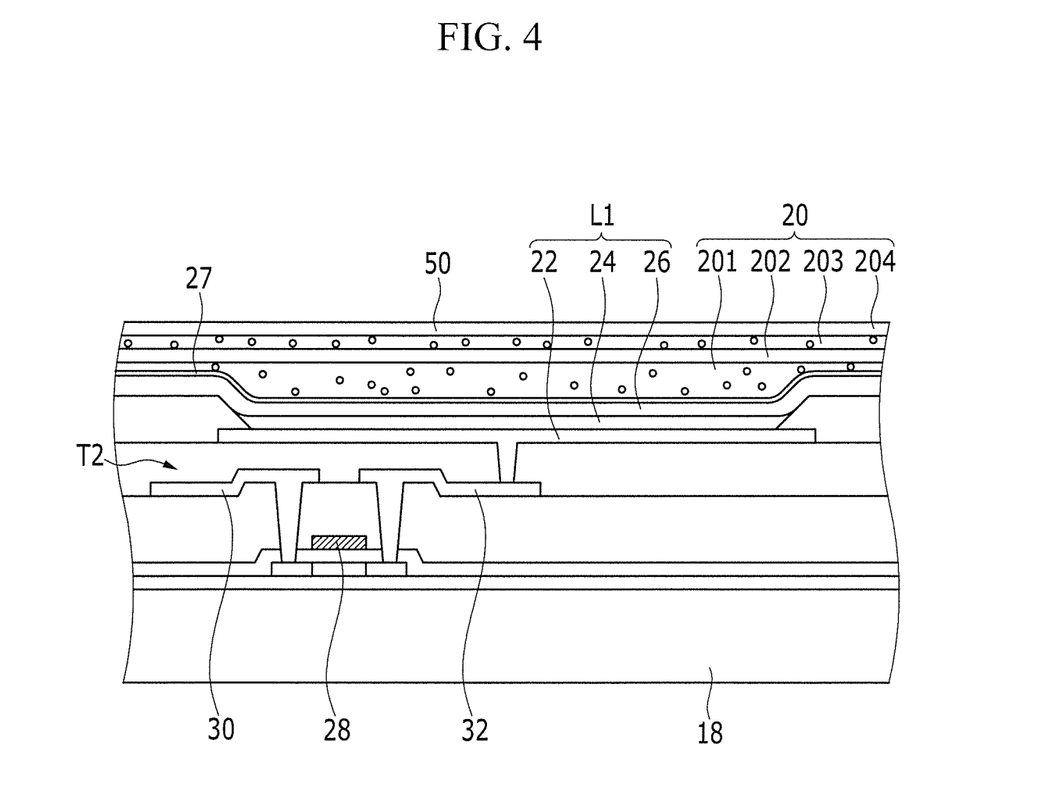
FIG. 4 is a cross-sectional view of an OLED display according to a second exemplary embodiment.

FIG. 4 is a cross-sectional view of an OLED display according to a second exemplary embodiment.

The second exemplary embodiment shown in FIG. 4 is substantially the same as the first exemplary embodiment shown in FIG. 2, except that scattering materials are dispersed only in an organic layer, such that repeated description will not be provided.

As shown in FIG. 4, scattering materials 50 are dispersed into only organic layers 201 and 203 forming a thin film encapsulation layer 20. When a scattering material 50 having a large diameter is formed in inorganic layers 202 and 204 each having a thickness of several Å, the thickness of the inorganic layers 202 and 204 may be non-uniform. Therefore, the thickness of the inorganic layers 202 and 204 may be maintained to be uniform by forming the scattering materials 50 only in the organic layers 201 and 203.

Here, although the scattering materials are dispersed throughout a plurality of organic layers forming the thin film encapsulation layer in the second exemplary embodiment, the scattering materials may be dispersed in a lower organic layer that is adjacent to an organic light emitting element among the plurality of organic layers.

Figure 5:
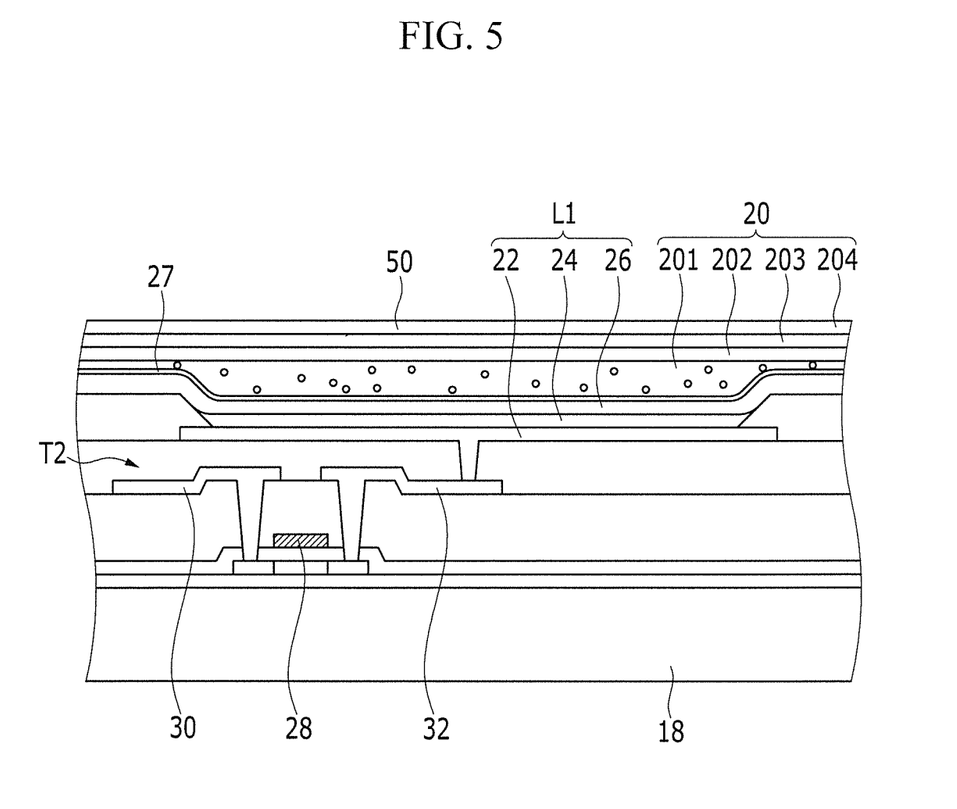
FIG. 5 is a cross-sectional view of an OLED display according to a third exemplary embodiment.

FIG. 5 is a cross-sectional view of an OLED display according to a third exemplary embodiment.

The third exemplary embodiment shown in FIG. 5 is substantially the same as the second exemplary embodiment shown in FIG. 4, except that scattering materials are dispersed only in a lower organic layer, such that repeated description will not be provided.

As shown in FIG. 5, scattering materials 50 are dispersed only in a lower organic layer 201 among a plurality of organic layers 201 and 203 forming a thin film encapsulation layer 20. When the scattering materials 50 are formed in the lower organic layer 201 adjacent to an organic light emitting element rather than being formed in an upper organic layer 203 adjacent to the external environment among the plurality of organic layers, light efficiency may be improved. That is, when the scattering materials 50 are formed in the lower organic layer 201 that is adjacent to an organic light emitting element L1 among the plurality of organic layers 201 and 203, light emitted from the organic light emitting element L1 is instantly scattered so that no or less light loss occurs, thereby improving light efficiency.

Here, although the scattering materials are uniformly dispersed in the respective organic layers forming the thin film encapsulation layer according to the second exemplary embodiment, the scattering materials may be dispersed more (e.g., much more) in a lower organic layer that is adjacent to the organic light emitting element than in an upper organic layer that is adjacent to the outside among the plurality of organic layers.

Figure 6:
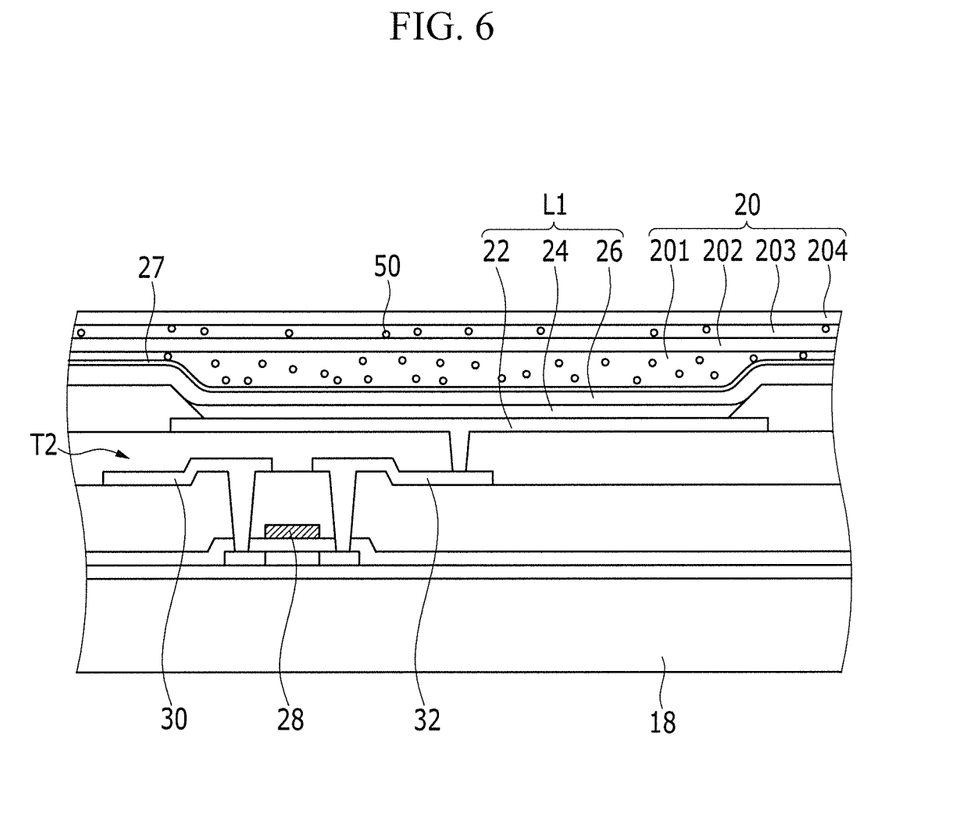
FIG. 6 is a cross-sectional view of an OLED display according to a fourth exemplary embodiment.

FIG. 6 is a cross-sectional view of an OLED display according to a fourth exemplary embodiment.

The fourth exemplary embodiment shown in FIG. 6 is substantially the same as the third exemplary embodiment shown in FIG. 4, except that scattering materials are dispersed more (e.g., much more) in a lower organic layer that is adjacent to an organic light emitting element than in an upper organic layer that is adjacent to the outside, such that repeated description will not be provided.

As shown in FIG. 6, scattering materials 50 are dispersed only in organic layers 201 and 203 forming a thin film encapsulation layer 20. In this case, the scattering materials 50 are dispersed more (e.g., much more) in the lower organic layer 201 that is adjacent to an organic light emitting element L1 than in the upper organic layer 203 that is adjacent to the outside among the plurality of organic layers 201 and 203. As described, light efficiency may be improved when the scattering materials 50 are dispersed more in the lower organic layer 201 that is adjacent to the organic light emitting element L1 than in the upper organic layer 203 that is adjacent to the outside among the plurality of organic layers 201 and 203. That is, when more (e.g., much more) of the scattering materials 50 are formed in the lower organic layer 201 that is adjacent to the organic light emitting element L1 among the plurality of organic layers 201 and 203, a large amount of light emitted from the organic light emitting element L1 is instantly scattered so that a light loss is decreased, thereby improving light efficiency.

While the present invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

| Description of Symbols | |
|---|---|
| 18: | substrate |
| 20: | thin film encapsulation layer |
| 22: | first pixel electrode |
| 24: | organic emission layer |
| 26: | second pixel electrode |
| 27: | covering layer |
| 50: | scattering material |
| 201, 203: | organic layer |
| 202, 204: | inorganic layer |

What is claimed is:

1. An organic light emitting diode (OLED) display comprising:
   a substrate and an organic light emitting element on the substrate;
   a thin film encapsulation layer on the substrate and covering the organic light emitting element; and
   one or more scattering materials dispersed in the thin film encapsulation layer and configured to scatter light emitted from the organic light emitting element,
   wherein a diameter of each of the one or more scattering materials is larger than 1/8 of a wavelength of light emitted from the organic light emitting element.

2. The OLED display of claim 1, wherein the thin film encapsulation layer comprises organic layers and inorganic layers, and the scattering materials are dispersed in the organic and inorganic layers.

3. The OLED display of claim 2, wherein refractive indexes of the scattering materials are between 1.5 and 3.0.

4. The OLED display of claim 1, wherein the thin film encapsulation layer comprises an organic layer and an inorganic layer, and the scattering materials are dispersed in the organic layer.

5. The OLED display of claim 4, wherein the organic layer and the inorganic layer comprise a plurality of alternately arranged organic layers and inorganic layers, and the scattering materials are in a lower organic layer adjacent to the organic light emitting element among the plurality of organic layers.

6. The OLED display of claim 4, wherein the organic layer and the inorganic layer comprise a plurality of alternately arranged organic layers and inorganic layers, and the scattering materials are formed more in a lower organic layer adjacent to the organic light emitting element than in an upper organic layer adjacent to the external environment among the plurality of organic layers.

7. The OLED display of claim 1, wherein diameters of the respective scattering materials are between 100 nm and 500 nm.

8. The OLED display of claim 1, wherein a refractive index difference between the thin film encapsulation layer and the scattering materials is between 0.2 and 1.7.

9. The OLED display of claim 1, wherein the scattering materials include at least one selected from $TiO_2$, $ZrO_2$, $CeO_2$, $TaO_2$, or combinations thereof.

10. The OLED display of claim 1, further comprising red pixels, green pixels, and blue pixels, wherein the thin film encapsulation layer and the scattering materials are configured to increase the light extraction efficiency for at least two of the colors of the red, green, and blue pixels, and
   wherein the thin film encapsulation layer comprises a homogenous material.

* * * * *